United States Patent
Wallner et al.

(10) Patent No.: US 9,899,257 B1
(45) Date of Patent: Feb. 20, 2018

(54) ETCH STOP LINER FOR CONTACT PUNCH THROUGH MITIGATION IN SOI SUBSTRATE

(71) Applicant: GLOBALFOUNDRIES Inc., Grand Cayman (KY)

(72) Inventors: Jin Z. Wallner, Albany, NY (US); Haoren Zhuang, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/448,873

(22) Filed: Mar. 3, 2017

(51) Int. Cl.
| | |
|---|---|
| *H01L 21/768* | (2006.01) |
| *H01L 21/762* | (2006.01) |
| *H01L 21/8234* | (2006.01) |
| *H01L 21/285* | (2006.01) |
| *H01L 27/12* | (2006.01) |
| *H01L 29/06* | (2006.01) |
| *H01L 29/08* | (2006.01) |
| *H01L 23/535* | (2006.01) |

(52) U.S. Cl.
CPC .. *H01L 21/76829* (2013.01); *H01L 21/28518* (2013.01); *H01L 21/76283* (2013.01); *H01L 21/76805* (2013.01); *H01L 21/76895* (2013.01); *H01L 21/823418* (2013.01); *H01L 21/823475* (2013.01); *H01L 21/823481* (2013.01); *H01L 23/535* (2013.01); *H01L 27/1203* (2013.01); *H01L 29/0649* (2013.01); *H01L 29/0847* (2013.01)

(58) Field of Classification Search
CPC ......... H01L 21/76829; H01L 21/76283; H01L 21/76805; H01L 21/76895; H01L 21/28518; H01L 21/823418; H01L 21/823475; H01L 21/823481; H01L 23/535; H01L 29/0649; H01L 29/0847
See application file for complete search history.

(56) References Cited

U.S. PATENT DOCUMENTS

| | | | |
|---|---|---|---|
| 6,657,276 B1 | 12/2003 | Karlsson et al. | |
| 2009/0039442 A1* | 2/2009 | Han | H01L 21/76232 257/384 |
| 2013/0087855 A1* | 4/2013 | Makiyama | H01L 21/84 257/350 |

(Continued)

*Primary Examiner* — Christine Enad
(74) *Attorney, Agent, or Firm* — Yuanmin Cai; Hoffman Warnick LLC

(57) ABSTRACT

A method of forming a shallow trench isolation (STI) in a semiconductor-on-insulator (SOI) substrate, including an etch stop liner, to mitigate punch through in SOI substrates is disclosed. The method may include providing an SOI substrate, forming an STI recess within the SOI substrate, forming a first STI dielectric fill within the STI recess wherein a top surface of the first STI dielectric fill is at a location above a top surface of the base substrate, forming a first etch stop liner on the first STI dielectric fill, and forming a second STI dielectric fill over the first etch stop liner. The first etch stop liner is configured so that portion of a contact opening later formed is positioned over the first etch stop liner such that the etch stop liner prevents punch through into the STI. The method may also include forming a second etch stop liner after forming the STI recess and before forming the first STI dielectric fill.

19 Claims, 8 Drawing Sheets

(56) References Cited

U.S. PATENT DOCUMENTS

| | | | | |
|---|---|---|---|---|
| 2013/0334603 A1* | 12/2013 | Cheng | ............... | H01L 21/76232 257/347 |
| 2015/0014790 A1* | 1/2015 | Peng | ................ | H01L 21/76224 257/401 |
| 2015/0228777 A1* | 8/2015 | Zhang | ............... | H01L 29/66545 257/347 |

* cited by examiner

ETCH STOP LINER FOR CONTACT PUNCH THROUGH MITIGATION IN SOI SUBSTRATE

BACKGROUND

The present disclosure relates to semiconductor device fabrication, and more specifically, to methods of mitigating contact punch through in a semiconductor-on-insulator (SOI) substrate.

Semiconductor-on-insulator technology (SOI) typically refers to the use of a layered semiconductor-insulator-semiconductor substrate in place of a more conventional semiconductor substrate (bulk substrate) in semiconductor manufacturing, especially microelectronics. SOI-based devices differ from conventional silicon-built devices in that the semiconductor junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost semiconductor-on-insulator (SOI) layer also vary widely with the intended application. SOI substrates are commonly used to form a large variety of devices such as: static random access memory (SRAM), clock synchronized RAM (CSRAM), logic devices, etc.

During formation of semiconductor devices, electrical contacts are formed through dielectric layers to electrically interconnect desired components with other components, e.g., source, drain or gates of a transistor. Each component is positioned within a selected layer within the semiconductor device that is covered by a dielectric. Typically, the contacts are formed by patterning a mask over the dielectric layer and etching to form an opening in the dielectric to the desired component therebelow. The opening is then filled with a liner and a conductor to form the contact. One challenge relative to forming contacts using SOI substrates is ensuring the contact opening does not extend into the layer below, which is referred to as "punch through." Punch through leads to the contact being in the wrong location and possibly making the device non-functional. Consequently, punch through can cause problems with yield during fabrication and/or performance degradation of the final device. The challenge of controlling punch through is magnified with smaller semiconductor devices, especially with current technology that is now creating wires smaller than 32 nanometers (nm). One approach to address punch through with SOI substrates is to control the etch selectivity of whatever etching technique is employed. This approach however is not always effective because, for example, it is difficult to effectively detect end points of the etching for the small contacts.

One type of punch through is referred to as "edge punch through" and refers to over-etching into a divot or recess next to a shallow trench isolation (STI) at the boundary of different regions of the substrate, e.g., between an active region and another region. STI is a form of isolation in which a trench is etched into the substrate and filled with an insulating material such as oxide, to isolate one region of the substrate from an adjacent region of the substrate. One or more transistors of a given polarity may be disposed within an area isolated by STI. Edge punch through can cause direct shorts to the underlying substrate.

SUMMARY

A first aspect of the disclosure is directed to a method of forming a shallow trench isolation (STI) in a semiconductor-on-insulator (SOI) substrate, the SOI substrate including a base substrate, a buried insulator layer over the base substrate, and an SOI layer over the buried insulator layer, the method including: forming an STI recess within the SOI substrate; forming a first STI dielectric fill within the STI recess, wherein a top surface of the first STI dielectric fill is at a location above a top surface of the base substrate; forming a first etch stop liner on the first STI dielectric fill; and forming a second STI dielectric fill over the first etch stop liner.

A second aspect of the disclosure includes a method of forming an integrated circuit (IC) structure, the method comprising: depositing a pad nitride layer on a semiconductor-on-insulator (SOI) substrate, the SOI substrate including a base substrate, a buried insulator layer over the base substrate, and an SOI layer over the buried insulator layer, the method including: depositing a pad oxide layer on the pad nitride layer; forming a shallow trench isolation (STI), including: forming a first STI recess within the SOI substrate; filling the first STI recess, with a first STI fill into the first STI recess; planarizing the first STI fill such that a surface of the pad oxide layer is exposed; forming a second STI recess within the first STI fill; forming a first etch stop liner over the first STI fill within the first STI recess; filling a remaining portion of the second STI recess with a second STI fill over the first etch stop liner; and planarizing the second STI fill such that the surface of the pad nitride layer is exposed; removing the pad oxide layer such that substantially all of the STI remains intact; removing an exposed portion of the first etch stop liner; forming an active region in the SOI substrate isolated from another region in the SOI substrate by the STI, the active region having a silicided source/drain region adjacent the STI; forming a contact etch top layer (CESL) over the active region and the STI; forming a dielectric layer over the CESL; forming a contact opening to the silicided source/drain region through the CESL and the dielectric layer, wherein a portion of the contact opening is positioned over the first etch stop liner such that the first etch stop liner prevents punch through into the STI; and forming a contact in the contact opening.

A third aspect of the disclosure is related to a semiconductor structure, comprising: a semiconductor-on-insulator (SOI) substrate including a shallow trench isolation (STI) therein, the STI including a first etch stop liner between the STI and an active region of the SOI substrate, wherein the first etch stop liner transverses the STI at a location above a top surface of the SOI substrate, and wherein the first etch stop liner is configured to prevent contact opening punch-through to the SOI substrate.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
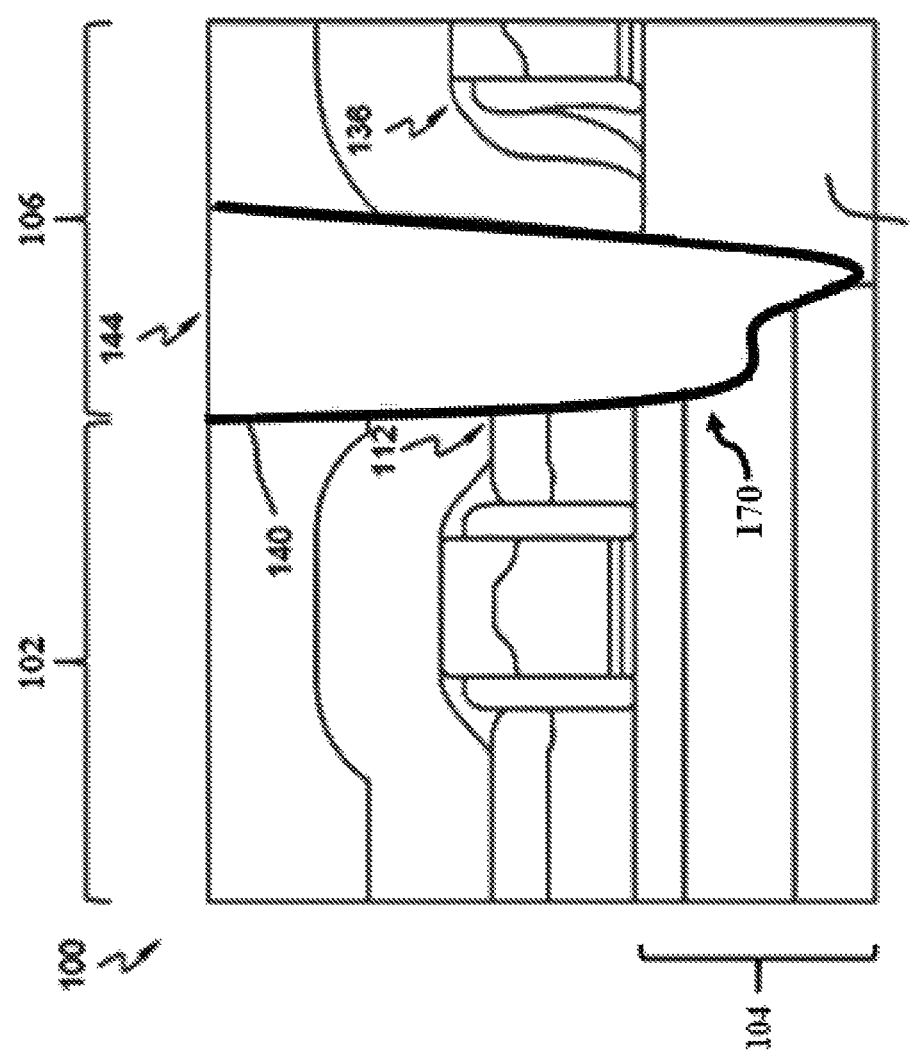
FIG. 1 shows a cross-sectional view of an example of a portion of a conventional prior art semiconductor structure, illustrating contact "punching-through" to the SOI substrate according to the prior art.

Referring to the drawings, FIG. 1 shows a cross-sectional view of an example of a portion of a conventional prior art semiconductor structure 100 illustrating contact punch-through. Conventional prior art semiconductor structure 100 includes an active region 102 in a semiconductor-on-insulator (SOI) substrate 104. Active region 102 is isolated from another region 106 in SOI substrate 104 by a shallow trench isolation (STI) 150. As illustrated, active region 102 includes a silicided source/drain region 112 adjacent STI 150. The other region 106 may include any region over STI 150 or beyond STI 150 that includes devices requiring isolation from active region 102. As shown in the FIG. 1, the other region may include for example, a dummy transistor 136. Prior art semiconductor structure 100 may be formed using any now known or later developed semiconductor fabrication techniques.

Prior art semiconductor structure 100 includes contact 144 within contact opening 140. At least a portion of contact opening 140 frequently overlaps an edge between active region 102 and more particularly, silicided source/drain region 112 and STI 150, causing the contact opening to exhibit "edge punch through" 170 relative to STI 150. When contact 144 is formed, the edge punch through can create direct shorts to SOI substrate 104, which at the very least negatively impacts performance and can render the device inoperative.

Figure 2:
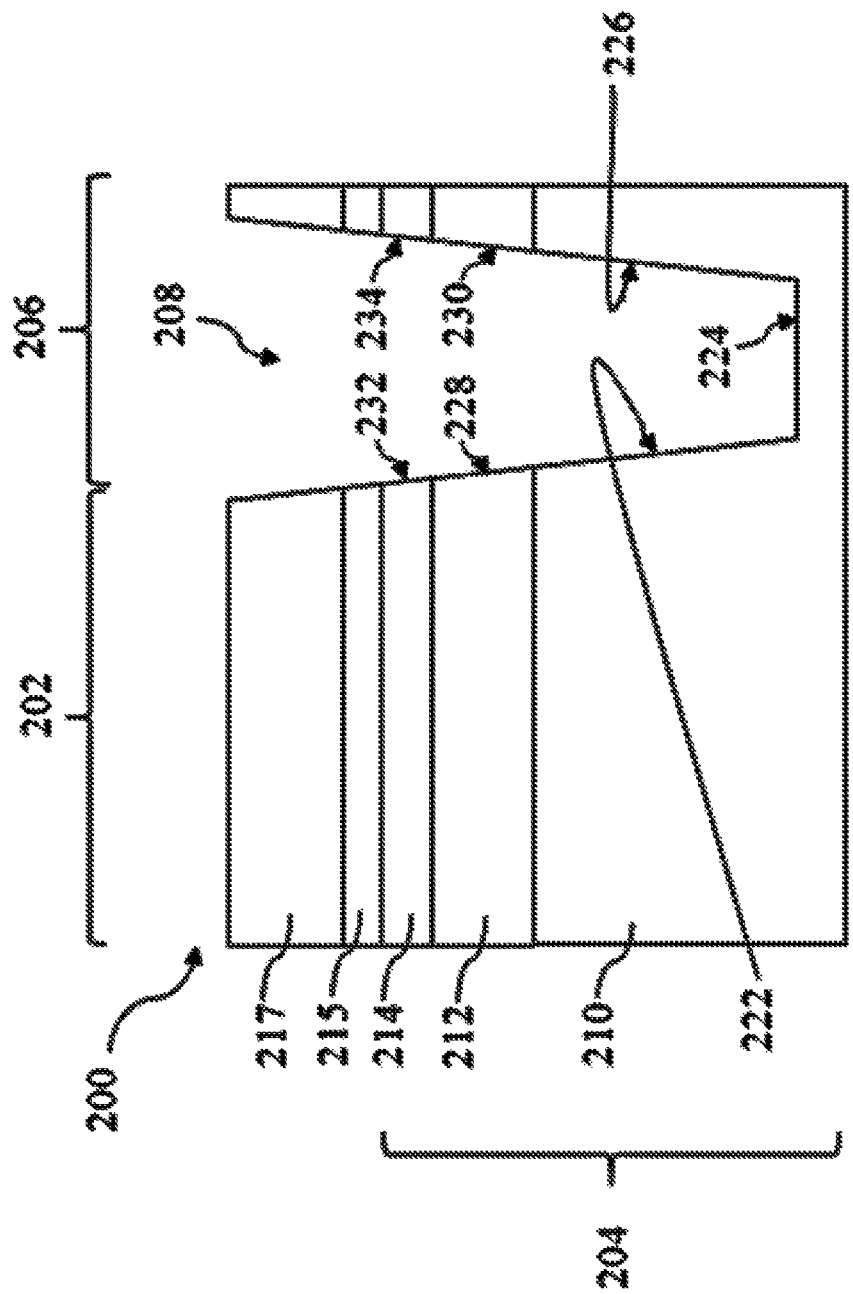
FIG. 2 shows a cross-sectional view of a portion of an initial semiconductor structure for forming an etch stop liner according to embodiments of the disclosure.

FIG. 2 shows a cross-sectional view of an initial structure 200 of a semiconductor structure for a method of forming first etch stop liner 260 (see FIG. 4) to prevent punch-through of contact opening 340 (see FIG. 6) to SOI substrate 204 during formation of the contact opening. At this stage, initial structure 200 is provided including a semiconductor-on-insulator (SOI) substrate 204 wherein a first region 202 of the SOI substrate 204 is isolated from another region 206 in SOI substrate 204 by trench 208 for shallow trench isolation (STI) 250 (see FIG. 5) etched into SOI substrate 204 (e.g., by RIE). SOI substrate 204 may include a semiconductor base substrate 210, an insulator layer 212 and a semiconductor-on-insulator (SOI) layer 214. As shown in the example of FIG. 2, initial structure 200 may also include pad layers 215, 217, formed over SOI substrate 204. As shown in the example of FIG. 2, formation of trench 208 may expose surfaces 222, 224, 226 of semiconductor base substrate 210, surfaces 228, 230 of insulator layer 212, and surfaces 232, 234 of SOI layer 214. As shown in the example of FIG. 2, surfaces (not labeled) of pad layers 215, 217 may also be exposed during the formation of trench 208.

Semiconductor base substrate 210 and SOI layer 214 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entirety of each layer may be strained. For example, SOI layer 214 (and/or epi layer thereover) may be strained.

Insulator layer 212 may include any now known or later developed dielectric used for SOI layers, such as but not limited to silicon dioxide or sapphire. As noted, the choice of insulator depends largely on intended, application, with sapphire being used for radiation-sensitive applications and silicon oxide preferred for improved performance and diminished short channel effects in microelectronics devices. The precise thickness of insulator layer 212 and topmost SOI layer 214 also vary widely with the intended application.

Pad layers 215, 217 may include any now known or later developed pad layers for formation of STI 250 (see FIG. 5), such as but not limited to pad oxide or pad nitride. For example, in the non-limiting example of FIG. 2, pad layer 215 may include a pad oxide layer and pad layer 217 may include a pad nitride layer. Wherein a pad nitride layer is selected, the layer may include, for example, any now known or later developed nitride barrier, such as but not limited to silicon nitride. Wherein a pad oxide layer is selected, the layer may include, for example, any now known or later developed pad oxide, such as but not limited to silicon oxide.

Initial structure 200 may be formed using any now known or later developed semiconductor fabrication techniques including by not limited to photolithography (and/or sidewall image transfer (SIT)). In lithography (or "photolithography"), a radiation sensitive "resist" coating is formed, e.g., deposited, over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Where materials are deposited, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

At this stage in conventional processing, the remainder of a shallow trench isolation (STI), such as STI 150 of FIG. 1, isolating first region 202 from other region 206, would be formed within trench 208 by filling trench 208 with an insulating material such as silicon oxide. The remainder of the semiconductor structure would then be formed, by conventional processing, including a contact opening to a silicided source/drain region. As shown in FIG. 1, and discussed above, at least a portion of the contact opening 140 frequently overlaps an edge 172 between active region 102, and more particularly, silicided source/drain region 112, and STI 150, causing the contact opening 140 to exhibit "edge punch through" 170 relative to the STI. As noted in the discussion of FIG. 1, when the contact is eventually formed, the edge punch through 170 can create direct shorts to SOI substrate 104, which at the very least negatively impacts performance and can render the device inoperative.

Figure 3:
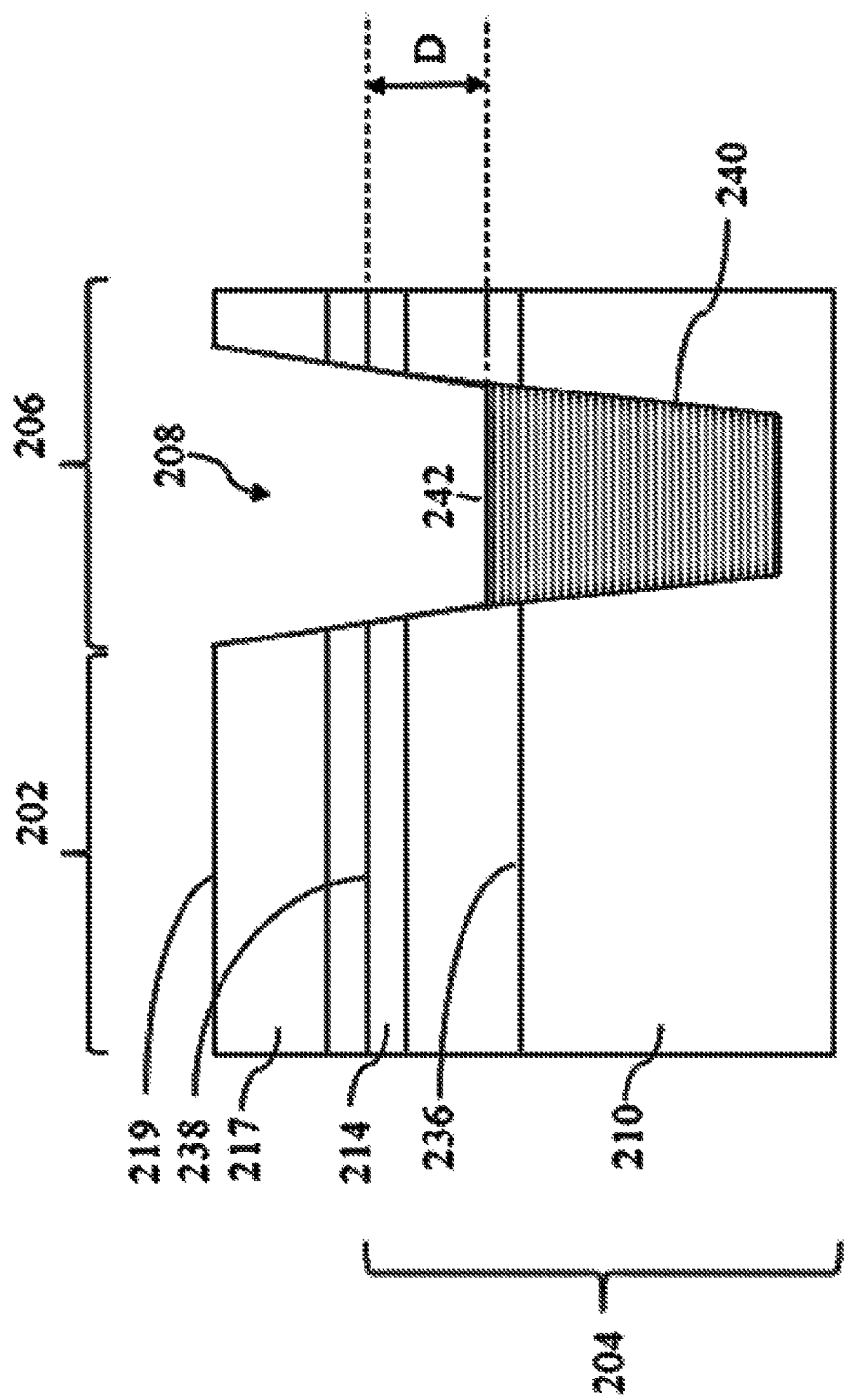
FIG. 3 shows a cross-sectional view of the portion of the initial semiconductor structure of FIG. 2 including forming a first shallow trench isolation (STI) fill according to embodiments of the disclosure.
Figure 4:
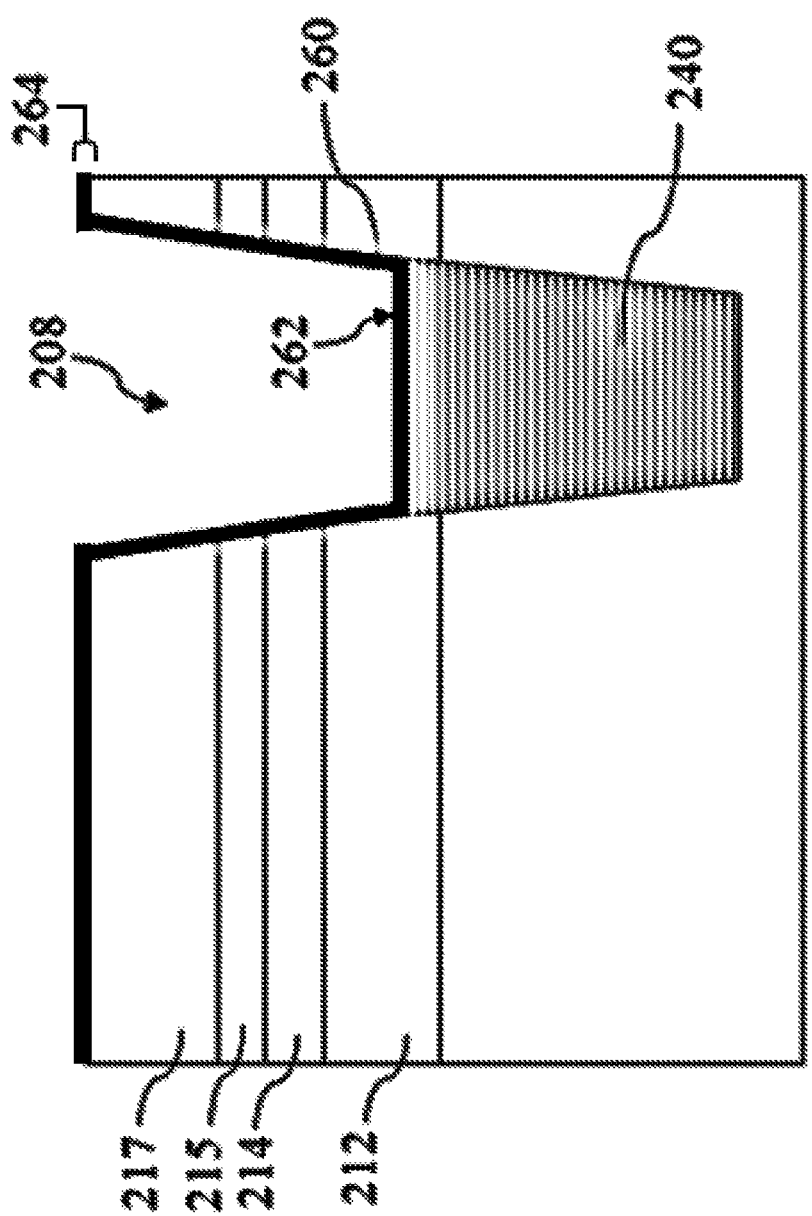
FIG. 4 shows a cross-sectional view of the portion of the semiconductor structure of FIG. 3 including forming a first etch stop liner according to embodiments of the disclosure.

As shown in FIGS. 3 and 4, in contrast to conventional processing, embodiments of the disclosure include forming a first etch stop liner 260 (see, FIG. 4) within an STI 250 (see FIG. 5), and in particular above top surface 236 of semiconductor base substrate 210.

Figure 6:
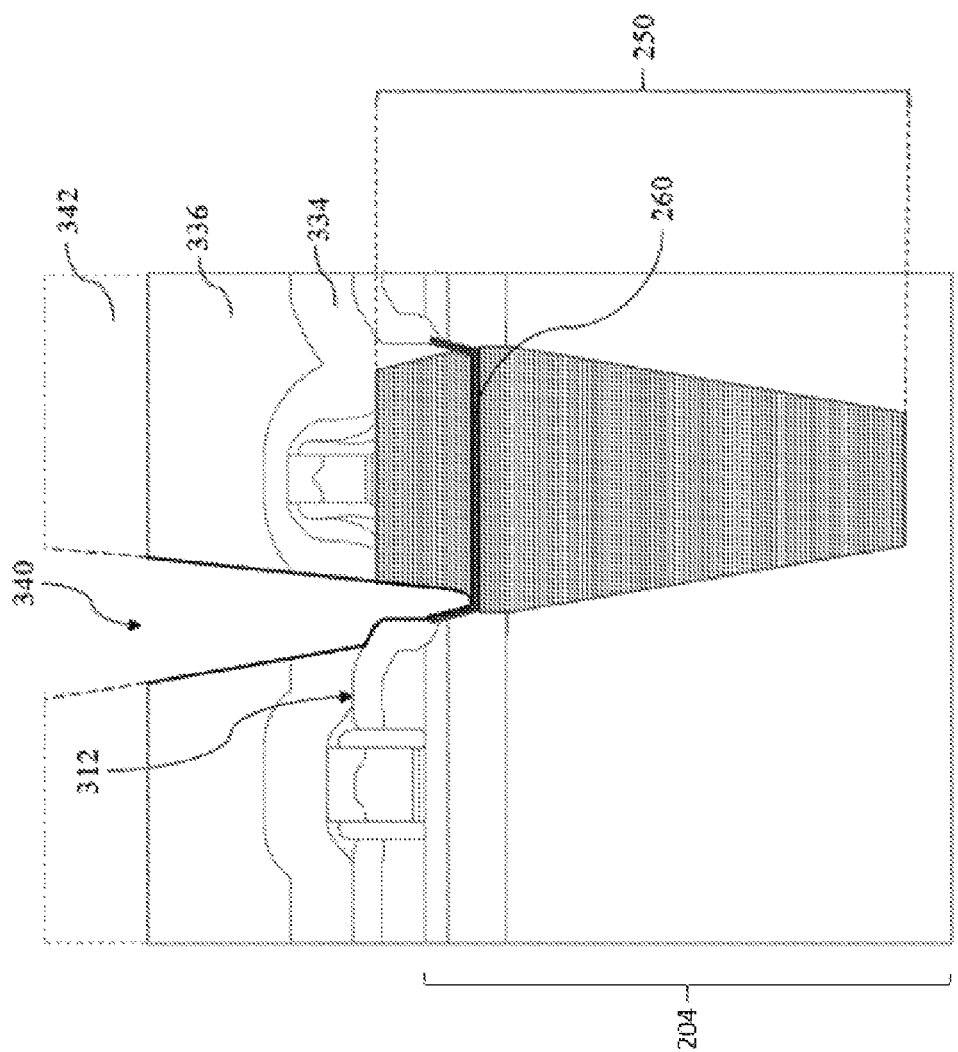
FIG. 6 shows a cross-sectional view of the portion of the semiconductor structure of FIG. 5 including forming contact openings, according to embodiments of the disclosure.

FIG. 3 shows forming a first shallow trench isolation (STI) dielectric fill 240 within trench 208 of initial structure 200 (see FIG. 2). First STI dielectric fill 240 may partially fill trench 208. For example, as shown in the illustrative example of FIG. 3, top surface 242 of first STI dielectric fill 240 may be located above a top surface 236 of semiconductor base substrate 210, and below a top surface 238 of SOI layer 214. Although top surface 242 of first STI dielectric fill 240 is shown in FIG. 3 at a particular location between top surface 236 of semiconductor base substrate 210, and top surface 238 of SOI layer 214, STI dielectric fill 240 may be formed so that top surface 242 is located at any desirable distance D from top surface 238 of SOI layer 214 sufficient for etch stop liner 260 to prevent the formation of contact opening 340 (see. FIG. 6) from resulting in punch through (see FIG. 1) to SOI substrate 204.

First STI dielectric fill 240 may be formed by deposition, CVD, enhanced high aspect ratio process (EHARP), and any other now known or later developed semiconductor STI fill fabrication technique. In one illustrative example, not shown, formation of first STI dielectric fill 240 may include depositing first STI dielectric fill 240 material over initial structure 200 (see FIG. 2), planarizing STI dielectric fill 240 with top surface 219 of pad layer 217, and etching first STI dielectric fill 240 so that top surface 242 of first STI dielectric fill 240 is located at desirable distance D from top surface 238 of SOI layer 214.

First STI dielectric fill 240 may include for example, insulating material such as silicon oxide, to isolate first region 202 of SOI substrate 204 from other region 206 of the substrate.

FIG. 4 shows forming a first etch stop liner 260 over first STI dielectric fill 240 of FIG. 3, according to embodiments of the disclosure. In contrast to conventional processing, as shown in FIG. 1, embodiments of the disclosure include forming a first etch stop liner 260 on first STI dielectric fill 240 within trench 208. First etch stop liner 260 may be configured to prevent punch through of contact opening 340 (see FIG. 6) to SOI substrate 204 during formation of the contact opening. First etch stop liner 260 may be top surface 262 and may have a thickness 264. In one embodiment, thickness 264 may include approximately 5 Angstroms (Å) to approximately 2000 Å.

First etch stop liner 260 may be formed on top surface 242 (see FIG. 3) of first STI dielectric fill 240, exposed surfaces 228, 230 (see FIG. 2) of insulator layer 212, exposed surfaces 232, 234 (see FIG. 2) of SOI layer 214, exposed surfaces of pad layers 215, 217 (not labeled) and top surface 219 (see FIG. 3) of pad layer 217. First etch stop liner 260 may be formed by deposition, CVD, ALD, or any other now known or later developed semiconductor liner fabrication techniques. In one illustrative example, not shown, formation of first etch stop liner 260 may include depositing first etch stop liner 260 material over initial structure 200 (see FIG. 2) including first STI dielectric fill 240 of FIG. 3 and top surface 219 (see FIG. 3) of pad layer 217, and planarizing the first etch stop liner 260 with top surface 219 (see FIG. 3) of pad layer 217.

First etch stop liner 260 may include, for example, hafnium oxide ($HfO_2$) hafnium nitride, hafnium oxynitride and any other material with etch selectivity sufficient to prevent punch through of contact opening 340 (see FIG. 6) to SOI layer 214 during formation of the contact opening.

Figure 5:
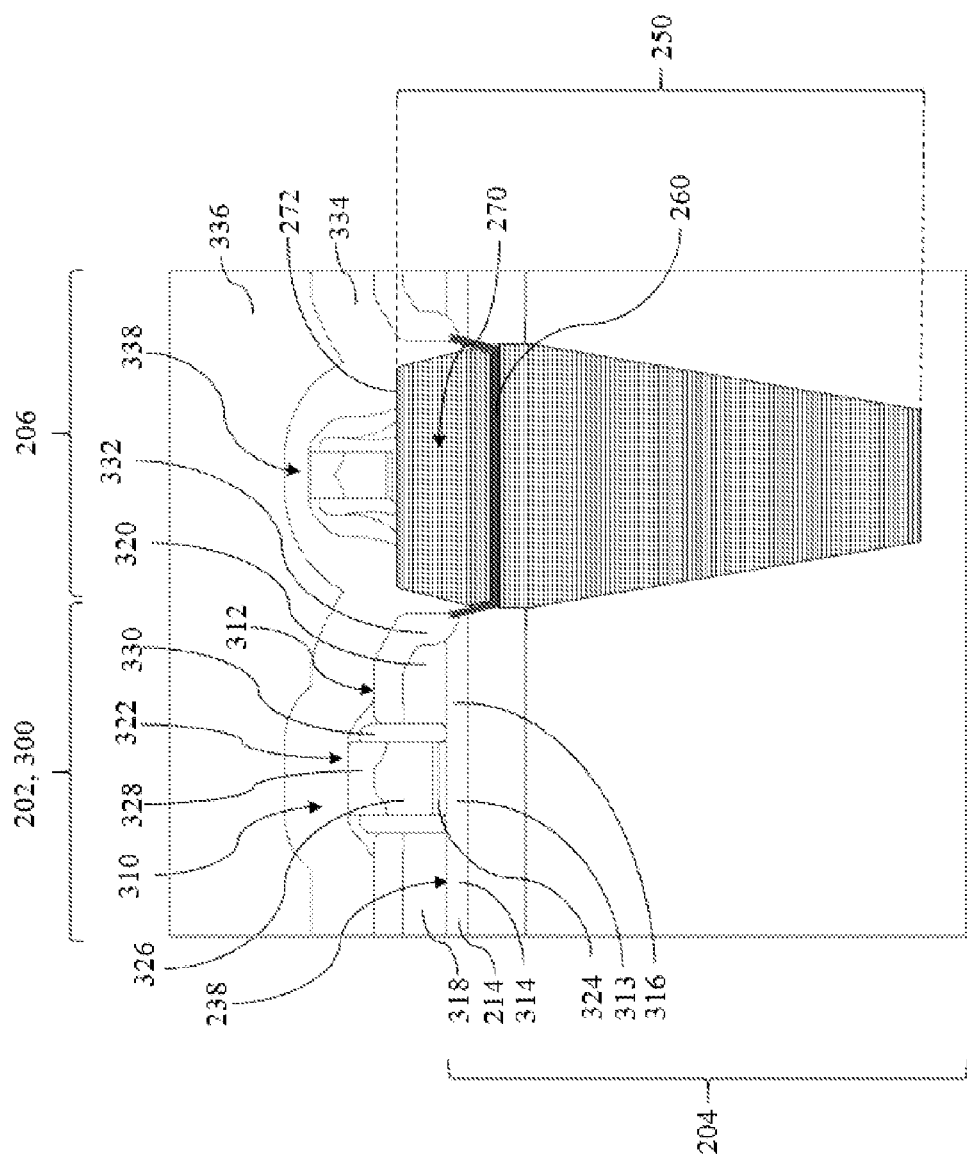
FIG. 5 shows a cross-sectional view of the portion of the semiconductor structure of FIG. 4, including additional processing before forming the contacts, according to embodiments of the disclosure.

FIG. 5 shows the remainder of conventional processing of the semiconductor structure of FIG. 4 before forming contact opening 340 (see FIG. 6), according to embodiments of the disclosure. The remainder of conventional processing of the semiconductor structure may include but is not limited to, for example, forming a second shallow trench isolation (STI) dielectric fill 270, removing pad layers 215, 217 (see FIGS. 2-4), removing exposed portions (not shown) of first etch stop liner 260 above top surface 238 of SOI layer 214, forming an active region 300 including a transistor 310, forming a contact etch stop layer (CESL) 334, forming a dielectric layer 336, and forming a dummy transistor 338.

As shown in FIG. 5, STI dielectric fill 270 may be formed to fill the remainder of trench 208 (see FIG. 4). Second STI dielectric fill 270 may be formed by deposition, CVD, EHARP, or any other now known or later developed semiconductor STI fill fabrication techniques. In one illustrative example, not shown, formation of second STI dielectric fill 270 may include depositing second STI dielectric fill 270 material over initial structure 200 (see FIG. 2) including first etch stop liner 260 (see FIG. 4), and planarizing second STI dielectric fill 270 so that top surface 272 of second STI dielectric fill 270 is approximately planar with top surface 219 (see FIG. 3) of pad layer 217 (see FIGS. 2-4). Second STI dielectric fill 270 may include for example, insulating material such as silicon oxide, to isolate first region 202 of SOI substrate 204 from other region 206 of the substrate.

Pad layers 215, 217 (see FIGS. 2-4) may be removed to re-expose top surface 238 of SOI layer 214. Pad layers 215, 217 (see FIGS. 2-4) may be removed for example by wet etch, dry etch, or any other now known or later developed semiconductor formation technique for removing pad layers. For example, wherein pad layer 217 (see FIGS. 2-4) includes a pad nitride layer, removal may include methods such as but not limited to deglazing and hot phosphoric acid etch or dry etch. For example, wherein pad layer 215 (see FIGS. 2-4) includes a pad oxide layer, removal may include methods such as but not limited to hydrofluoric acid (HF) etch.

Portions (not shown) of first etch stop liner 260, above top surface 238 of SOI layer 214, may be exposed after removal of pad layers 215, 217 (see FIGS. 2-4). Exposed portions (not shown) of first etch stop liner 260 may be removed by, e.g. surface plasma treatment followed by wet etching, or any other now known or later developed semiconductor manufacturing technique for removal of etch stop liner 260 material. As illustrated in the example of FIG. 5, removal of exposed portions (not shown) of first etch stop liner 260 may include causing first etch stop liner 260 to be approximately planar with top surface 238 of SOI layer 214.

Active region 300 may be formed within first region 202 and may include any region of SOI substrate 204 in which active devices are employed. In the instant example, a transistor 310 including silicided source/drain region 312 is formed in active region 300. Transistor 310 may otherwise include a channel region 313 in SOI layer 214 between source/drain regions 314, 316. Raised source/drain regions 318, 320 may be formed over source/drain regions 314, 316, e.g. by epitaxial growth of silicon germanium. As understood, regions 314, 316, 318, 320 may be doped, e.g., by ion implanting or in-situ doped as formed. As also known, a dopant element introduced into semiconductor can establish either p-type (acceptors) or n-type (donors) conductivity. Common dopants in silicon: for p-type—boron (B), indium (In); and for n-type—phosphorous (P) arsenic (As), antimony (Sb). Dopants are of two types—"donors" and "acceptors." N type implants are donors and P type are acceptors.

Transistor 310 may also include a gate 322 including one or more gate dielectric layers 324, including but not limited to: hafnium silicate (HfSiO), hafnium oxide ($HfO_2$), zirconium silicate ($ZrSiO_x$), zirconium oxide($ZrO_2$), silicon oxide ($SiO_2$), silicon nitride ($Si_3N_4$), silicon oxynitride (SiON), high-k material or any combination of these materials. Gate 322 may also include a conductive body 326 (e.g., a metal such as copper or tungsten, or polysilicon), a silicide cap 328 and a spacer 330 thereabout. Spacer 330 may include any now known or later developed spacer material such as silicon nitride.

Silicide cap 328 on gate 322 and a silicide 332 of silicided source/drain region 312 may be formed using any now known or later developed technique, e.g., performing an in-situ pre-clean, depositing a metal such as titanium, nickel, cobalt, etc., annealing to have the metal react with silicon, and removing unreacted metal.

CESL 334 may be formed over active region 300 and other region 206. CESL 334 may include any now known or later developed etch stop material such as silicon nitride. In one embodiment, CESL 334 includes a stress therein, e.g., compressive or tensile, so as to impart a strain to at least part of active region 300, in a known fashion.

Dielectric layer 336 may be formed over CESL 334, e.g., by deposition. Dielectric layer 336 may include may include any interlevel or intralevel dielectric material including inorganic dielectric materials, organic dielectric materials, or combinations thereof. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

As shown in FIG. 5, a dummy transistor 338 may be formed over STI 250. Dummy transistor 228 may be formed similarly to transistor 310.

FIG. 6 shows forming contact opening 340 to silicided source/drain region 312 through CESL 334 and dielectric layer 336, according to embodiments of the disclosure. Contact opening 340 may be formed using photolithography, i.e., with a mask 342 (in phantom) which can be removed in a conventional manner once opening 340 is formed. As illustrated, a portion of contact opening 340 is positioned over first etch stop liner 260 such that the etch stop liner prevents punch through into STI 250 and further into SOI substrate 204. In this fashion, first etch stop liner 260 accommodates mis-alignment of contact opening 340 with silicided source/drain region 312 or oversizing of contact opening 340, and prevents punch through into STI 250 and further into SOI substrate 204.

Figure 7:
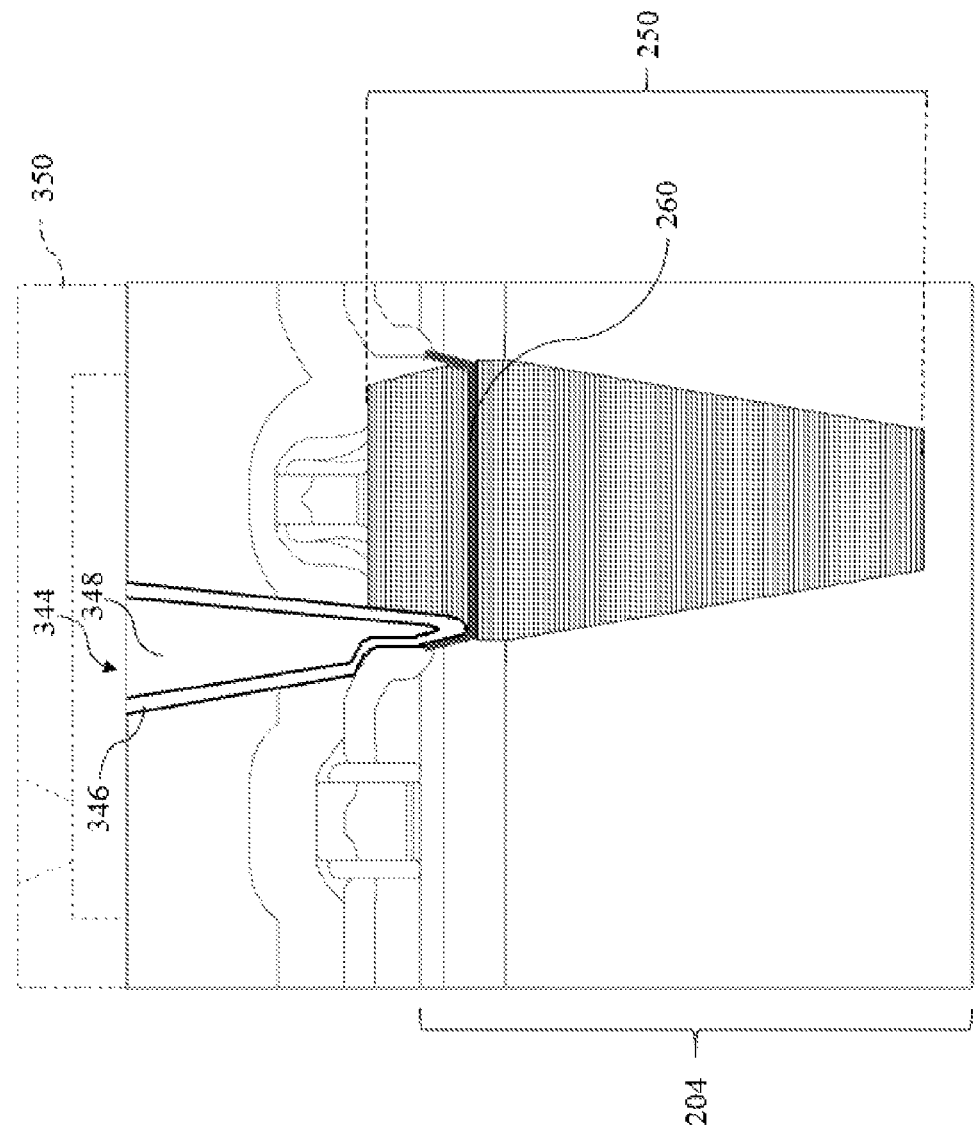
FIG. 7 shows a cross-sectional view of the portion of the semiconductor structure of FIG. 6 including forming a liner and contact in the contact opening, according to embodiments of the disclosure.

FIG. 7 shows forming a contact 344 in contact opening 340 (see FIG. 6). Contact 344 forming may include depositing a liner 346 in contact opening 340 (see FIG. 6), then depositing a conductor 348 in contact opening 340 (see FIG. 6) and planarizing the conductor. Liner 346 may include any conventional liner material such as ruthenium; however, other refractory metals such as tantalum (Ta), titanium (Ti), tungsten (W), iridium (Ir), rhodium (Rh) and platinum (Pt), etc., or mixtures of thereof, may also be employed. Conductor 348 may include, for example, copper or tungsten. The planarizing can be carried out using any now known or later developed technique such as but not limited to chemical mechanical planarization (CMP). FIG. 7 also shows, in phantom, conventional forming of back-end-of-line (BEOL) interconnects 350 to contact 344. As illustrated in FIG. 7, first etch stop liner 260 prevents punch-through of contact 344 to SOI substrate 204.

It is emphasized that method of forming contact 344 may include any variety of intermediate steps not described herein but understood with those with skill in the art.

Figure 8:
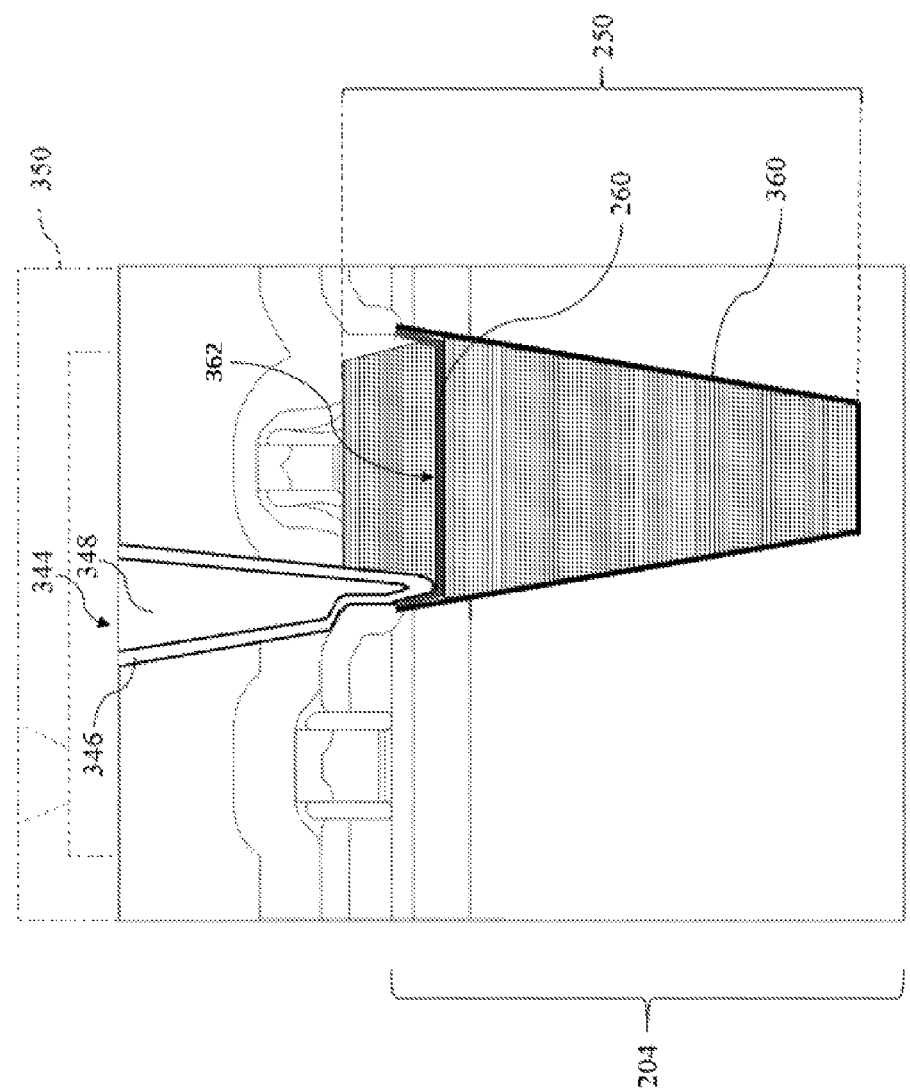
FIG. 8 shows a cross-sectional view of the portion of the semiconductor structure of FIG. 7, illustrating an alternative embodiment including a second etch stop liner, according to embodiments of the disclosure.

FIG. 8 shows another example of a portion of a semiconductor structure including first etch stop liner 260, and further a second etch stop liner 360 according to embodiments of the disclosure. In addition to the formation of first etch stop liner 260, a second etch stop liner 360 may be formed within STI 250. For example, as shown in FIG. 8, second etch stop liner 360 may be formed within trench 208 (see FIG. 2), over exposed surfaces 222, 224, 226 (see FIG. 2) of semiconductor base substrate 210 (see FIG. 2), exposed surfaces 228, 230 (see FIG. 2) of insulator layer 212 (see FIG. 2), exposed surfaces 232, 234 (see FIG. 2) of SOI layer 214 (see FIG. 2), and exposed surfaces (not shown) of pad layers 215, 217 (see FIG. 2) before formation of first STI dielectric fill 240. Second etch stop liner 360 may include a top surface 362. First STI dielectric fill 240 may then be formed, as shown in the illustrative example of FIG. 8, over top surface 362 of second etch stop liner 260 by the processes described herein. Further, first etch stop liner 260 may then be formed, as shown in the illustrative example of FIG. 8, on first STI dielectric fill 240 so as to cover the remainder of top surface 362 of second etch stop liner 260 by the processes described herein. Then, for example, the remainder of the semiconductor processing may then be performed, as described herein with respect to FIGS. 5-7.

Second etch stop liner 260 may have a thickness 364. In one embodiment, thickness 364 may be approximately 5 Å to approximately 2000 Å. Second etch stop liner 360 may be formed by deposition, CVD, ALD, or any other now known or later developed semiconductor manufacturing technique for forming etch stop liners. In one illustrative example, not shown, formation of second etch stop liner 360 may include depositing second etch stop liner 360 material over initial structure 200 (see FIG. 2), and planarizing the second etch stop liner 360 so as to re-expose top surface 219 (see FIGS. 2-4) of pad liner 217 (see FIGS. 2-4). Exposed portions (not shown) of second etch stop liner 360, above top surface 238 (see FIG. 3) of SOI layer 214 (see FIG. 3), which may be exposed after removal of pad layers 215, 217 (see FIGS. 2-4), may be removed for example by a surface plasma treatment followed by wet etching, or any other now known or later developed semiconductor manufacturing technique for removing etch stop liner materials. Removal of second etch stop liner 360 may also include, for example, causing second etch stop liner 360 to be planar with SOI layer 214 (see FIG. 3).

Second etch stop liner 360 may include, for example, hafnium oxide, hafnium nitride, hafnium oxynitride and any other material sufficient to prevent punch through of contact opening 340 to SOI substrate 204 during formation of the contact opening. In another illustrative example, second etch stop liner 360 may include, for example, silicon dioxide, silicon nitride, hafnium nitride, hafnium oxynitride and any other material desirable for the formation of the semiconductor structure.

As illustrated in FIG. 8, second etch stop liner 360 may be configured to further protect, against punch-through of contact 344 to SOI substrate 204, alongside first etch stop liner 260.

The methods of forming an etch stop liner herein provide a cost effective manner of mitigating edge punch through with no additional masks and with minor additional processing involved. The additional processing steps do not significantly increase processing time.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/− 10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a shallow trench isolation (STI) in a semiconductor-on-insulator (SOI) substrate, the SOI substrate including a base substrate, a buried insulator layer over the base substrate, and an SOI layer over the buried insulator layer, the method including:
    forming an STI recess within the SOI substrate;
    forming a first STI dielectric fill within the STI recess, wherein a top surface of the first STI dielectric fill is at a location above a top surface of the base substrate;
    forming a first etch stop liner on the first STI dielectric fill; and
    forming a second STI dielectric fill over the first etch stop liner to form the STI;
    forming an integrated circuit (IC) structure on the SOI substrate adjacent to the STI; and
    forming a contact structure to a portion of the IC structure, wherein the contact structure contacts a portion of the first etch stop liner and a portion of the second STI dielectric fill such that the portion of the first etch stop liner is positioned between the contact structure and the first STI dielectric fill, and wherein the first etch stop liner prevents punch-through of the contact structure into the base substrate.

2. The method of claim 1, further comprising forming a second etch stop liner between the first STI dielectric fill and the active region of the SOI substrate, and between the second STI dielectric fill and the active region of the SOI substrate, wherein the second etch stop liner extends between the active region of the base substrate and the first etch stop liner.

3. The method of claim 2, wherein the first etch stop liner and the second etch stop liner include a different material composition.

4. The method of claim 2, wherein the second etch stop liner has a thickness of approximately 5 Å to approximately 2000 Å.

5. The method of claim 2, wherein the second etch stop liner includes a material selected from the group consisting of silicon dioxide, hafnium oxide, silicon nitride, hafnium nitride, and hafnium oxynitride.

6. The method of claim 1, further comprising forming a pad liner on the SOI substrate before forming the STI.

7. The method of claim 1, wherein the first etch stop liner includes a material selected from the group consisting of hafnium oxide, hafnium nitride, and hafnium oxynitride.

8. The method of claim 1, wherein the first etch stop liner includes hafnium oxide.

9. The method of claim 1, wherein forming the IC structure, includes:
    forming a silicided source/drain region on a top surface of the SOI substrate;
    forming a contact etch stop layer (CESL) over the silicided source/drain region; and
    forming a dielectric layer over the CESL.

10. The method of claim 9, further comprising forming a set of back-end-of-line (BEOL) interconnects over the dielectric layer to the contact structure.

11. The method of claim 1, wherein the first etch stop liner has a thickness of approximately 5 Å to approximately 2000 Å.

12. A method of forming an integrated circuit (IC) structure, the method comprising:
    depositing a pad nitride layer on a semiconductor-on-insulator (SOI) substrate, the SOI substrate including a base substrate, a buried insulator layer over the base substrate, and an SOI layer over the buried insulator layer, the method including:
    depositing a pad oxide layer on the pad nitride layer;
    forming a shallow trench isolation (STI), including:
        forming a first STI recess within the SOI substrate;
        filling the first STI recess, with a first STI fill into the first STI recess;
        planarizing the first STI fill such that a surface of the pad oxide layer is exposed;
        forming a second STI recess within the first STI fill;
        forming a first etch stop liner over the first STI fill within the first STI recess;
        filling a remaining portion of the second STI recess with a second STI fill over the first etch stop liner; and
        planarizing the second STI fill such that the surface of the pad nitride layer is exposed;
    removing the pad oxide layer such that substantially all of the STI remains intact;
    removing an exposed portion of the first etch stop liner;
    forming an active region in the SOI substrate isolated from another region in the SOI substrate by the STI, the active region having a silicided source/drain region adjacent the STI;
    forming a contact etch stop layer (CESL) over the active region and the STI;
    forming a dielectric layer over the CESL;
    forming a contact opening to the silicided source/drain region through the CESL and the dielectric layer, wherein a portion of the contact opening is positioned over the first etch stop liner such that the first etch stop liner prevents punch through into the STI; and
    forming a contact in the contact opening.

13. A semiconductor structure, comprising:
    a semiconductor-on-insulator (SOI) substrate including a base substrate, a buried insulator layer over the base substrate, and an SOI layer over the buried insulator layer;
    a shallow trench isolation (STI) in the SOI substrate, the STI including:
        a first etch stop liner positioned above a first STI dielectric fill of the STI and below a second STI dielectric fill of the STI at a location above a top surface of the SOI substrate, wherein the first etch stop liner extends between the STI and an active region of the SOI substrate;
    an integrated circuit (IC) structure positioned on the SOI substrate adjacent to the STI; and
    a contact structure to the IC structure, wherein the contact structure contacts a portion of the first etch stop liner and a portion of the second STI dielectric fill such that the portion of the first etch stop liner is positioned between the contact structure and the second STI dielectric fill, wherein the first etch stop liner prevents punch-through of the contact structure into the base substrate.

14. The semiconductor structure of claim 13, further comprising a second etch stop liner between the STI and the active region, wherein the second etch stop liner extends between the active region of the SOI substrate and the first etch stop liner.

15. The semiconductor structure of claim 14, wherein the first etch stop liner and the second etch stop liner include a different material composition.

16. The semiconductor structure of claim 14, wherein the second etch stop liner includes a material selected from the group consisting of silicon nitride, silicon dioxide, hafnium oxide, hafnium nitride, and hafnium oxynitride.

17. The semiconductor structure of claim 14, wherein the second etch stop liner has a thickness of approximately 5 Å to approximately 2000 Å.

18. The semiconductor structure of claim 13, wherein the first etch stop liner includes a material selected from the group consisting of hafnium oxide, hafnium nitride, and hafnium oxynitride.

19. The semiconductor structure of claim 13, wherein the first etch stop liner has a thickness of approximately 5 Å to approximately 2000 Å.

* * * * *